United States Patent
Zhao et al.

(10) Patent No.: US 12,361,190 B1
(45) Date of Patent: Jul. 15, 2025

(54) THREE-DIMENSIONAL CHARACTERIZATION METHOD OF HYDROCARBON SECONDARY MIGRATION CHANNEL

(71) Applicant: Southwest Petroleum University, Chengdu (CN)

(72) Inventors: Xiaoming Zhao, Chengdu (CN); Yan Zhen, Chengdu (CN); Wenjing Ran, Chengdu (CN); Jiawang Ge, Chengdu (CN); Li Liu, Chengdu (CN); Kun Qi, Chengdu (CN)

(73) Assignee: Southwest Petroleum University, Chengdu (CN)

( * ) Notice: Subject to any disclaimer, the term of this patent is extended or adjusted under 35 U.S.C. 154(b) by 0 days.

(21) Appl. No.: 18/806,718

(22) Filed: Aug. 16, 2024

(30) Foreign Application Priority Data

Dec. 28, 2023 (CN) .......................... 202311868691.2

(51) Int. Cl.
*G06F 30/28* (2020.01)
*E21B 43/14* (2006.01)

(52) U.S. Cl.
CPC .............. *G06F 30/28* (2020.01); *E21B 43/14* (2013.01); *G01V 2210/642* (2013.01); *G01V 2210/644* (2013.01); *G01V 2210/66* (2013.01)

(58) Field of Classification Search
CPC .......... G06F 30/28; G06F 30/20; E21B 43/14; G01V 2210/642; G01V 2210/644; G01V 2210/66
See application file for complete search history.

(56) References Cited

U.S. PATENT DOCUMENTS

| | | | | |
|---|---|---|---|---|
| 2016/0103246 A1* | 4/2016 | Freeman | ................ | G01V 20/00 703/10 |
| 2023/0043782 A1* | 2/2023 | Durand Riard | ........ | G01V 20/00 |
| 2023/0057978 A1* | 2/2023 | Forge | .................... | G01V 20/00 |

OTHER PUBLICATIONS

Soni et al. "An Integrated Case Study from Seismic to Simulation through Geostatistical Inversion" (Year: 2008).*
Wu et al. "Combined Seismic Inversion Methods in Reservoir Model Development" (Year: 2007).*

(Continued)

*Primary Examiner* — Rehana Perveen
*Assistant Examiner* — Troy A Maust

(57) ABSTRACT

A three-dimensional characterization method of a hydrocarbon secondary migration channel includes: step 1, collecting lithofacies seismic inversion data of a research area, and constructing a three-dimensional geological model including mudstone and sandstone; step 2, performing lithofacies attribute determination and updating on planar mudstone data; step 3, performing lithofacies attribute determination and updating on sectional mudstone data; step 4, adding fault data and updating lithofacies attributes according to an intersection relationship between a sand body distribution area and the fault to obtain a model intersecting with the fault and a model without intersecting with the fault; step 5, performing a zigzag connectivity judgment on a sand body distribution area to obtain a judgment result, and updating lithofacies attributes according to the judgment result; step 6, obtaining a target three-dimensional geological model; and step 7, determining the hydrocarbon secondary migration channel.

5 Claims, 5 Drawing Sheets

(56) References Cited

OTHER PUBLICATIONS

Merchan et al. "Characterization Of Estuary-Shoreface Type Reservoir Using Outcrop Analogue And Modeling Of Flow Using A Nonuniform Coarsened Grid" (Year: 2002).*

Yin et al. "A hierarchical streamline-assisted history matching approach with global and local parameter updates" (Year: 2011).*

* cited by examiner

THREE-DIMENSIONAL CHARACTERIZATION METHOD OF HYDROCARBON SECONDARY MIGRATION CHANNEL

CROSS-REFERENCE TO RELATED APPLICATION

This application claims priority to a Chinese patent application No. 202311868691.2, filed to China National Intellectual Property Administration (CNIPA) on Dec. 28, 2023, which is herein incorporated by reference in its entirety.

TECHNICAL FIELD

The present disclosure relates to the technical field of a hydrocarbon secondary migration channel in oil fields, and more particularly to a three-dimensional characterization method of a hydrocarbon secondary migration channel.

BACKGROUND

Hydrocarbon secondary migration refers to all migration processes of hydrocarbons from a source rock stratum into a carrier bed, and is the most important link in the process of petroleum accumulations. A direction of the hydrocarbon secondary migration shows its behavior in a dredging layer, and when encountering an advantageous closed structure, the petroleum accumulation is formed. Therefore, the hydrocarbon secondary migration has a crucial guiding effect on the positioning and development of the petroleum accumulation. However, currently, a mainstream characterization method of a hydrocarbon secondary migration channel adopts a two-dimensional model, and a comprehensive analysis is performed on the direction of the hydrocarbon secondary migration and an advantageous channel of the hydrocarbons through two-dimensional geological information. But the analysis based on the two-dimensional model only considers the migration of the hydrocarbons in one direction, which is limited. Therefore, as a very important part of oil-gas exploration, the characterization method of the hydrocarbon secondary migration channel also has some problems to be solved urgently.

At present, the analysis method or characterization method of the hydrocarbon secondary migration channel mainly includes the following three methods. 1. A power model of the hydrocarbon secondary migration is constructed based on an Arc geographic information system (ArcGIS) software, so as to simulate the direction of the hydrocarbon secondary migration; and a potential flow of fluid is used as the direction of the hydrocarbon secondary migration, and a simulation result of the power model of the hydrocarbon secondary migration is presented as a two-dimensional raster graphic. 2. A two-dimensional basin modeling method is used to simulate the evolutionary history of hydrocarbon secondary migration, and conditions for the petroleum accumulation are comprehensively compared based on characteristics of a research area. 3. A new mode for degrading, enriching, and transporting the hydrocarbons is constructed by using basic principles of the hydrocarbon transportation and the hydrocarbon secondary migration in combination with basin construction and stratum features. However, the above methods only consider spatial characteristics of a two-dimensional plane and the lateral migration of the hydrocarbons, and the above characterization methods are limited to a two-dimensional plane, which lacks the comprehensive display of the three-dimensional spatial information. The hydrocarbon secondary migration is divided into a vertical migration and a lateral migration, and the simulation of the hydrocarbon secondary migration channel limited by the two-dimensional characterization tends to ignore the influence of the migration of the hydrocarbons in the other direction on the petroleum accumulation.

SUMMARY

In view of the above problems, the present disclosure aims to provide a three-dimensional characterization method of a hydrocarbon secondary migration channel.

A technical solution of the present disclosure is as follows.

The three-dimensional characterization method of the hydrocarbon secondary migration channel includes the following step 1 through step 7:

Step 1, collecting lithofacies seismic inversion data of a research area, and constructing a first three-dimensional geological model of the research area based on the lithofacies seismic inversion data; dividing the first three-dimensional geological model into multiple grids according to lithofacies data of the first three-dimensional geological model, with each grid having one of lithofacies attributes, and the lithofacies attributes including mudstone and sandstone.

Step 2, performing lithofacies attribute determination and updating on planar mudstone data of the first three-dimensional geological model to obtain a second three-dimensional geological model.

Step 3, performing lithofacies attribute determination and updating on sectional mudstone data of the second three-dimensional geological model to obtain a third three-dimensional geological model.

Step 4, adding fault data of a fault into the third three-dimensional geological model, and updating lithofacies attributes of the sandstone in the third three-dimensional geological model according to an intersection relationship between a sand body distribution area and the fault to obtain a fourth three-dimensional geological model intersecting with the fault and a fifth three-dimensional geological model without intersecting with the fault.

Step 5, performing a zigzag connectivity judgment on a sand body distribution area in the fifth three-dimensional geological model to obtain a judgment result, and updating lithofacies attributes of the fifth three-dimensional geological model according to the judgment result to obtain a sixth three-dimensional geological model.

Step 6, obtaining a target three-dimensional geological model of the research area according to the fourth three-dimensional geological model and the sixth three-dimensional geological model.

Step 7, determining the hydrocarbon secondary migration channel of the research area according to a lithofacies attribute of each grid in the target three-dimensional geological model.

Specially, the three-dimensional characterization method of the hydrocarbon secondary migration channel further includes the following steps: obtaining an area with a largest aggregation probability of hydrocarbons, and performing oil-gas exploration on the area with the largest aggregation probability of hydrocarbons to obtain an oil-gas reservoir.

In an embodiment, in the step 2, the performing lithofacies attribute determination and updating on planar mudstone data specially includes the following steps:

in response to grids before, after, and on left and right of one of the multiple grids which has the lithofacies attribute of the mudstone all having the lithofacies attribute of the sandstone, updating the lithofacies attribute of the one grid to a new value 1 (also referred to a third target value); and in response to the grids before, after, and on the left and right of the one grid not all having the lithofacies attribute of the sandstone, maintaining the lithofacies attribute of the one grid unchanged.

In an embodiment, in the step 3, the performing lithofacies attribute determination and updating on sectional mudstone data specially includes the following steps:

in response to grids in upper and lower layers adjacent to one of the multiple grids which has the lithofacies attribute of the mudstone all having the lithofacies attribute of the sandstone, updating the lithofacies attribute of the one grid to the new value 1; and in response to the grids in the upper and lower layers adjacent to the one grid which has the lithofacies attribute of the mudstone not all having the lithofacies attribute of the sandstone, maintaining the lithofacies attribute of the one grid unchanged;

determining and updating an updated grid obtained in the step 2 as follows:

in response to any grid in upper and lower layers adjacent to the updated grid having the lithofacies attribute of the mudstone, updating a lithofacies attribute of the updated grid to the mudstone; and in response to no grid in the upper and lower layers adjacent to the updated grid having the lithofacies attribute of the mudstone, maintaining the lithofacies attribute of the updated grid unchanged.

In an embodiment, the step 4 specifically includes the following sub-steps:

Step 41, fitting boundary ranges of sandstones in the third three-dimensional geological model into continuous first surface data, and introducing the fault data of the fault into the third three-dimensional geological model, and fitting the fault data of the fault introduced into the third three-dimensional geological model into second surface data;

Step 42, screening out a sand body surface in each layer intersecting with the fault through geographic coordinates and elevation data of the research area based on three-dimensional intersection judgment, and outputting the sand body surface in each layer as an intermediate three-dimensional geological model and outputting a part of the sand body distribution area without intersecting with the fault as the fifth three-dimensional geological model; and Step 43, updating lithofacies attributes of discrete sand body data intersecting with the fault in the intermediate three-dimensional geological model to a new value 2 (also referred to a first target value) and maintaining lithofacies attributes of another part of the sand body distribution area without intersecting with the fault in the intermediate three-dimensional geological model unchanged, thereby to obtain the fourth three-dimensional geological model.

In an embodiment, in the step 5, the performing a zigzag connectivity judgment on a sand body distribution area in the fifth three-dimensional geological model to obtain a judgment result, and updating lithofacies attributes of the fifth three-dimensional geological model according to the judgment result specifically includes the following steps:

for a target sand body area without intersecting with the fault in each layer of the fifth three-dimensional geological model, determining whether there is a sand body area in upper and lower layers adjacent to the target sand body area intersecting with the target sand body area:

in response to determining that there is the sand body area in the upper and lower layers adjacent to the target sand body area intersecting with the target sand body area, determining whether there is the fault passing through the sand body area:

in response to determining that there is the fault passing through the sand body area, determining the target sand body area being a zigzag connected sand body, and updating lithofacies attributes of the target sand body area to a new value 3 (also referred to a second target value);

in response to determining that there is not the fault passing through the sand body area, determining the target sand body area being an isolated sand body, and maintaining the lithofacies attributes of the target sand body area unchanged;

in response to determining that there is not the sand body area in the upper and lower layers adjacent to the target sand body area intersecting with the target sand body area, determining the target sand body area being the isolated sand body, and maintaining the lithofacies attributes of the target sand body area unchanged.

In an embodiment, in the step 7, the determining the hydrocarbon secondary migration channel of the research area specially includes the following steps:

determining an area with updated lithofacies attributes obtained in the step 4 in the target three-dimensional geological model as an area with a largest aggregation probability of hydrocarbons;

determining a connectivity between the area with the updated lithofacies attributes obtained in the step 4 and an area with updated lithofacies attributes obtained in the step 5 in the target three-dimensional geological model being good, and the areas with the updated lithofacies attributes obtained in the steps 4-5 being capable of migrating the hydrocarbons;

determining an area with updated lithofacies attributes obtained in the step 2 and an area with updated lithofacies attributes obtained in the step 3 in the target three-dimensional geological model as a semi-permeable area with a poor connectivity;

determining an area with lithofacies attributes of the sandstone in the target three-dimensional geological model as an isolated sand body area without aggregating and migrating the hydrocarbons; and determining an area with lithofacies attributes of the mudstone in the target three-dimensional geological model as a non-connected area.

Beneficial effects of the present disclosure are as follows.

The target three-dimensional geological model constructed by the present disclosure can reflect the sand body area through which the fault continuously passes, an overlapping relationship between the sand bodies inside the target three-dimensional geological model, and the contact relationship on sectional surfaces of the target three-dimensional geological model, so that the present disclosure can more accurately determine the sand body connectivity and explore the hydrocarbon migration channel of the research area, thereby providing more accurate guidance for the hydrocarbon development.

BRIEF DESCRIPTION OF DRAWINGS

In order to more clearly illustrate embodiments of the present disclosure or the technical solutions in the related art, attached drawings required in the description of the embodiments or the related art will be briefly described below. Apparently, the attached drawings in the following description are merely some embodiments of the present disclosure, and for those skilled in the related art, other drawings may be obtained according to the attached drawings without creative efforts.

DETAILED DESCRIPTION OF EMBODIMENTS

Figure 1:
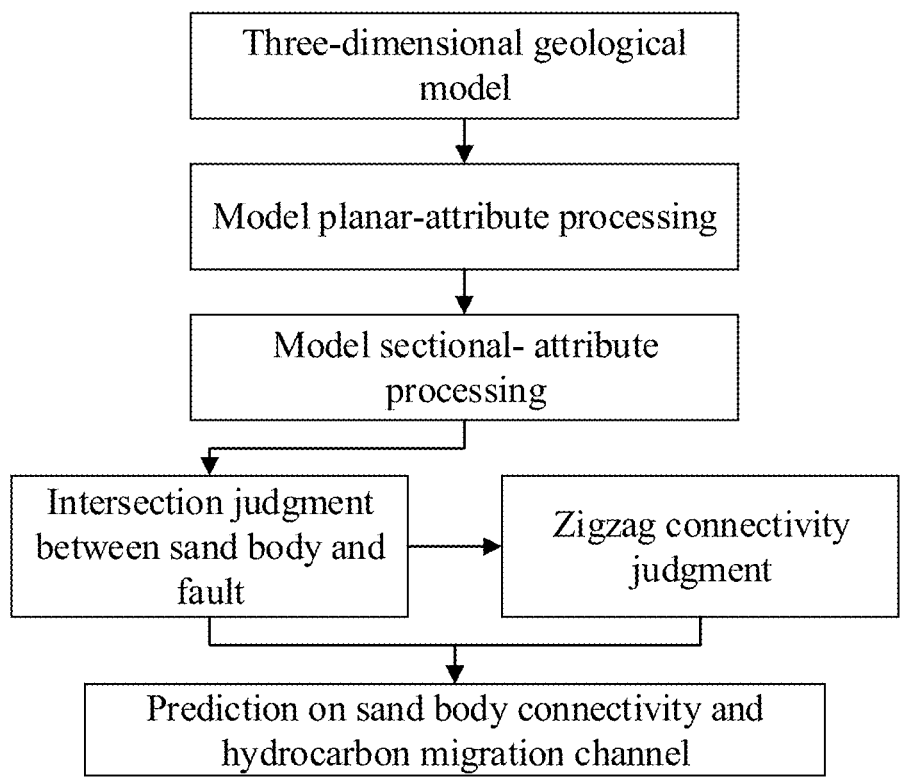
FIG. 1 illustrates a schematic flowchart of a three-dimensional characterization method of a hydrocarbon secondary migration channel according to the present disclosure.
Figure 2:
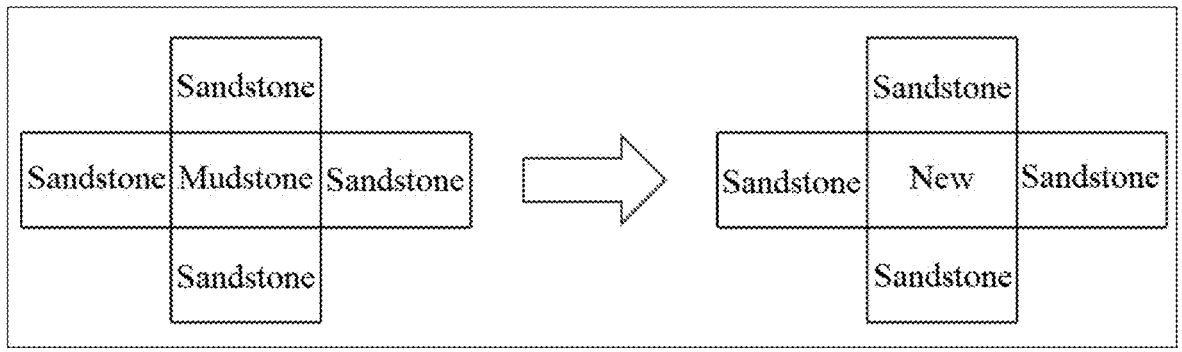
FIG. 2 illustrates a schematic diagram of a processing principle for a semi-permeable sand body during model planar-attribute processing.
Figure 3:
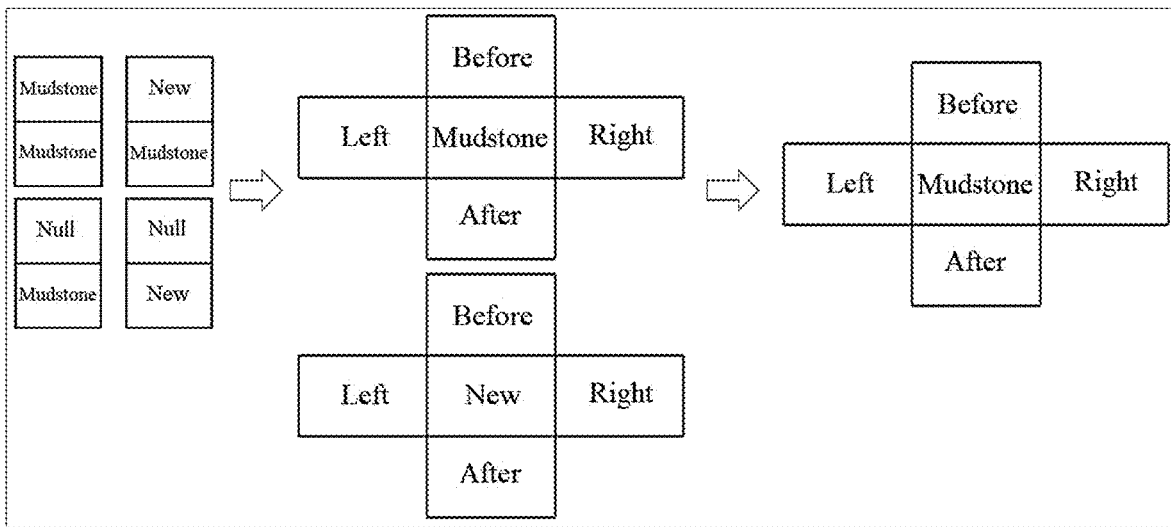
FIG. 3 illustrates a schematic diagram of a processing principle for a non-connected sand body during the model planar-attribute processing.
Figure 4:
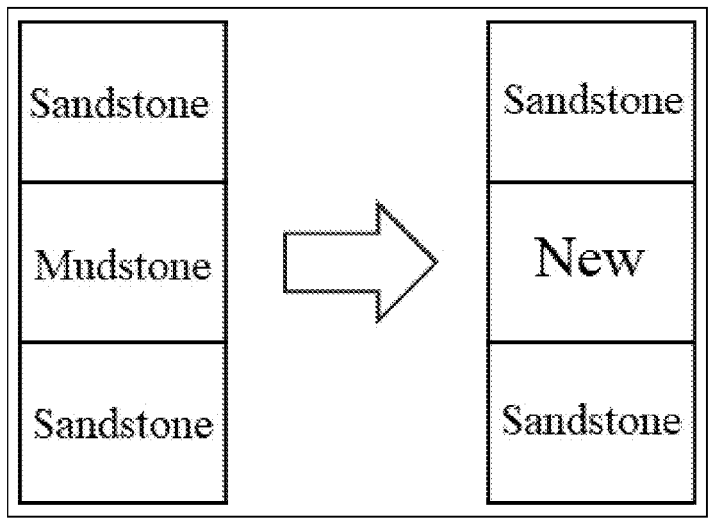
FIG. 4 illustrates a schematic diagram of a processing principle for the semi-permeable sand body during model sectional-attribute processing.
Figure 5:
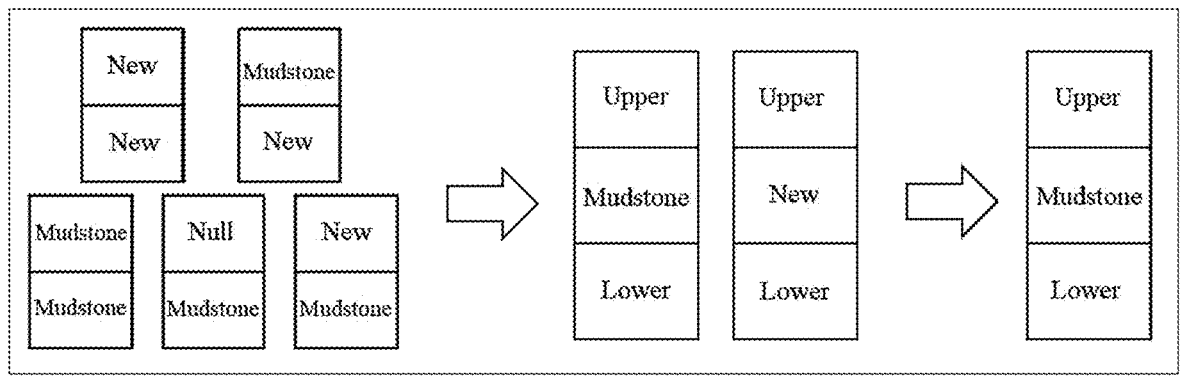
FIG. 5 illustrates a schematic diagram of a processing principle for the non-connected sand body during the model sectional-attribute processing.
Figure 6:
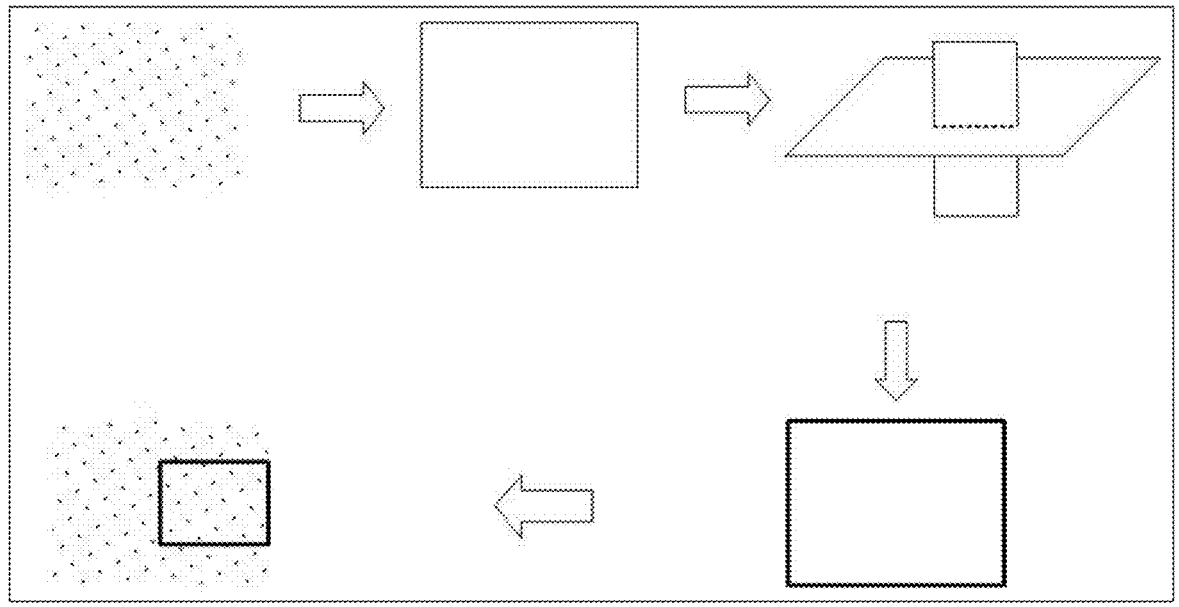
FIG. 6 illustrates a schematic flowchart for screening a fault passing through a sand body.
Figure 7:
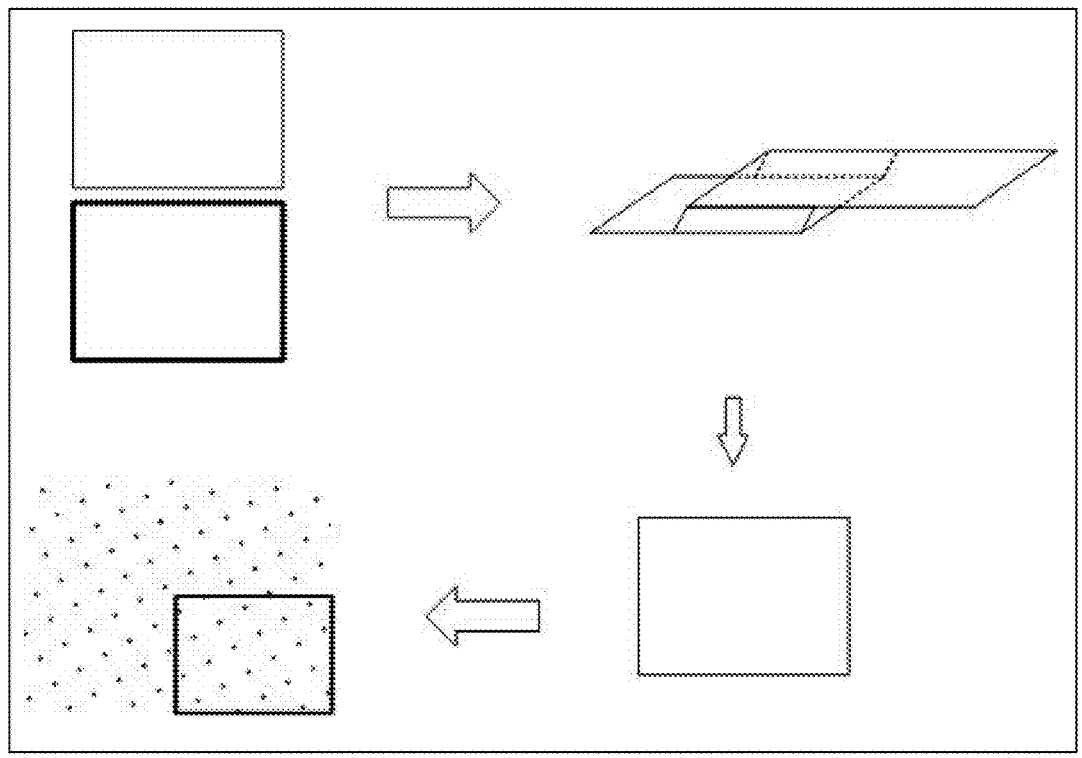
FIG. 7 illustrates a schematic diagram for judging a zigzag connectivity sand body.

The present disclosure will be further described below with reference to the attached drawings and the embodiments. It should be noted that, in the case of no conflict, the embodiments in the present disclosure and the technical features in the embodiments may be combined with each other. It should be noted that, unless otherwise specified, all technical and scientific terms used in the present have the same meaning as commonly understood by those skilled in the related art to which the present disclosure belongs. The terms "include" or "comprise" used in the present disclosure mean that elements or objects in front of the word encompass the elements or objects listed after the word and their equivalents, but do not exclude other elements or objects.

As shown in FIGS. 1-7, the present disclosure provides a three-dimensional characterization method of a hydrocarbon secondary migration channel, including the following steps.

Step 1: lithofacies seismic inversion data of a research area is collected, and a first three-dimensional geological model of the research area is constructed based on the lithofacies seismic inversion data; and then the first three-dimensional geological model is divided into multiple grids according to lithofacies data of the first three-dimensional geological model, with each grid having one of lithofacies attributes, and the lithofacies attributes including mudstone and sandstone.

Step 2: lithofacies attribute determination and updating is performed on planar mudstone data of the first three-dimensional geological model to obtain a second three-dimensional geological model.

In an illustrated embodiment, the lithofacies attribute determination and updating performed on the planar mudstone data of the first three-dimensional geological model in the step 2 specially includes the following steps.

When grids before, after, and on left and right of the mudstone grid (referred to one of the multiple grids which has the lithofacies attribute of the mudstone) are all sandstone grids (referred to the grids having the lithofacies attribute of the sandstone), the lithofacies attribute of the mudstone grid is updated to a new value 1 (referred to a third target value).

In addition, when the grids before, after, and on the left and right of the mudstone grid are not all the sandstone grids, the lithofacies attribute of the mudstone grid is maintained unchanged.

It should be noted that hydrocarbons generally migrate along an object source direction of the hydrocarbons or a direction perpendicular to the object source direction of the hydrocarbons, and therefore, in the above embodiment, when planar lithofacies data (including the planar mudstone data) is processed, only the lithofacies attributes of the grids disposed before, after, and on the left and right of the target gird are considered.

Step 3: lithofacies attribute determination and updating is performed on sectional mudstone data of the second three-dimensional geological model to obtain a third three-dimensional geological model.

Specially, in the above embodiment, it should be noted that the lithofacies data of the first three-dimensional geological model is included in the lithofacies seismic inversion data of the research area; and the planar mudstone data of the first three-dimensional geological model and the sectional mudstone data of the second three-dimensional geological model are included in the lithofacies data of the first three-dimensional geological model.

In an illustrated embodiment, the lithofacies attribute determination and updating performed on the sectional mudstone data of the second three-dimensional geological model specially includes the following steps.

When grids disposed in upper and lower layers adjacent to the mudstone grid are all sandstone grids, the lithofacies attribute of the mudstone grid is updated to the new value 1.

In addition, when the grids disposed in upper and lower layers adjacent to the mudstone grid are not all the sandstone grids, the lithofacies attribute of the mudstone grid is maintained unchanged.

In an illustrated embodiment, the step 3 further includes: determining and updating an updated grid obtained in the step 2 as follows.

When any grid disposed in upper and lower layers adjacent to the updated grid is the mudstone grid, a lithofacies attribute of the updated grid is updated to the mudstone.

In addition, when no grid disposed in the upper and lower layers adjacent to the updated grid is the mudstone grid, the lithofacies attribute of the updated grid is maintained unchanged.

Step 4: fault data of a fault is added into the third three-dimensional geological model, and lithofacies attributes of the sandstone are updated in the third three-dimensional geological model according to an intersection relationship between a sand body distribution area and the fault to obtain a fourth three-dimensional geological model intersecting with the fault and a fifth three-dimensional geological model without intersecting with the fault.

In an illustrated embodiment, the step 4 specifically includes the following sub-steps.

Step 41, boundary ranges of sandstones in the third three-dimensional geological model are fitted into continuous first surface data, and the fault data of the fault is introduced into the third three-dimensional geological model, and the fault data of the fault introduced into the third three-dimensional geological model is fitted into second surface data.

Step 42: a sand body surface in each layer intersecting with the fault is screened out through geographic coordinates and elevation data of the research area based on three-dimensional intersection judgment, and the sand body surface in each layer is output as an intermediate three-dimensional geological model and a part of the sand body distribution area without intersecting with the fault is output as the fifth three-dimensional geological model.

Step 43: lithofacies attributes of discrete sand body data intersecting with the fault in the intermediate three-dimensional geological model are updated to a new value 2 (also referred to a first target value) and lithofacies attributes of another part of the sand body distribution area without intersecting with the fault in the intermediate three-dimensional geological model are maintained unchanged, thereby to obtain the fourth three-dimensional geological model.

It should be noted that the step 4 is mainly to process the sandstones, and therefore, optionally, before the sub-step 41, mudstones and the lithofacies attributes updated in the third three-dimensional geological model can be removed, i.e., only the sandstones are retained, and then subsequent sub-steps are performed. However, correspondingly, before obtaining the fifth three-dimensional geological model and the fourth three-dimensional geological model, the removed mudstones and the lithofacies attributes updated in the third three-dimensional geological model need to be reintroduced, and then the model output is performed, so that the output model includes the sandstones, the mudstone, and the updated lithofacies attributes.

Step 5: a zigzag connectivity judgment is performed on a sand body distribution area in the fifth three-dimensional geological model to obtain a judgment result, and lithofacies attributes of the fifth three-dimensional geological model are updated according to the judgment result to obtain a sixth three-dimensional geological model.

In an illustrated embodiment, the zigzag connectivity judgment performed on the sand body distribution area to update the lithofacies attributes of the fifth three-dimensional geological model based on the judgment result specially includes the following sub-steps.

For a target sand body area without intersecting with the fault in each layer of the fifth three-dimensional geological model, whether there is a sand body area in upper and lower layers adjacent to the target sand body area intersecting with the target sand body area is determined.

Specially, when determining that there is the sand body area in the upper and lower layers adjacent to the target sand body area intersecting with the target sand body area, whether there is the fault passing through the sand body area is further determined.

Moreover, when determining that there is the fault passing through the sand body area, the target sand body area is determined as a zigzag connected sand body, and lithofacies attributes of the target sand body area are updated to a new value 3 (also referred to a second target value).

While determining that there is not the fault passing through the sand body surface, the target sand body area is determined as an isolated sand body, and the lithofacies attributes of the target sand body area are maintained unchanged.

In addition, while determining that there is not the sand body area in the upper and lower layers adjacent to the target sand body area intersecting with the target sand body area, the target sand body area is determined as the isolated sand body, and the lithofacies attributes of the target sand body area are maintained unchanged.

Step 6: a target three-dimensional geological model of the research area is obtained according to the fourth three-dimensional geological model and the sixth three-dimensional geological model.

Step 7: the hydrocarbon secondary migration channel of the research area is determined according to a lithofacies attribute of each grid in the target three-dimensional geological model.

In an illustrated embodiment, the hydrocarbon secondary migration channel of the research area determined in the step 7 specially includes the following steps.

In the target three-dimensional geological model, an area with updated lithofacies attributes obtained in the step 4 is determined as an area with a largest aggregation probability of the hydrocarbons.

In the target three-dimensional geological model, a connectivity between the area with the updated lithofacies attributes obtained in the step 4 and an area with updated lithofacies attributes obtained in the step 5 is determined being good, and the areas with the updated lithofacies attributes obtained in the steps 4-5 are capable of migrating the hydrocarbons.

In the target three-dimensional geological model, an area with updated lithofacies attributes obtained in the step 2 and an area with updated lithofacies attributes obtained in the step 3 are determined as a semi-permeable area with a poor connectivity.

In the target three-dimensional geological model, an area with lithofacies attributes of the sandstone is determined as an isolated sand body area than cannot aggregate nor migrate the hydrocarbons.

In the target three-dimensional geological model, an area with lithofacies attributes of the mudstone is determined as a non-connected area.

Figure 8:
FIG. 8 illustrates a schematic diagram of a prediction result of attributes for sand body connectivity according to an illustrated embodiment of the present disclosure.
Figure 9:
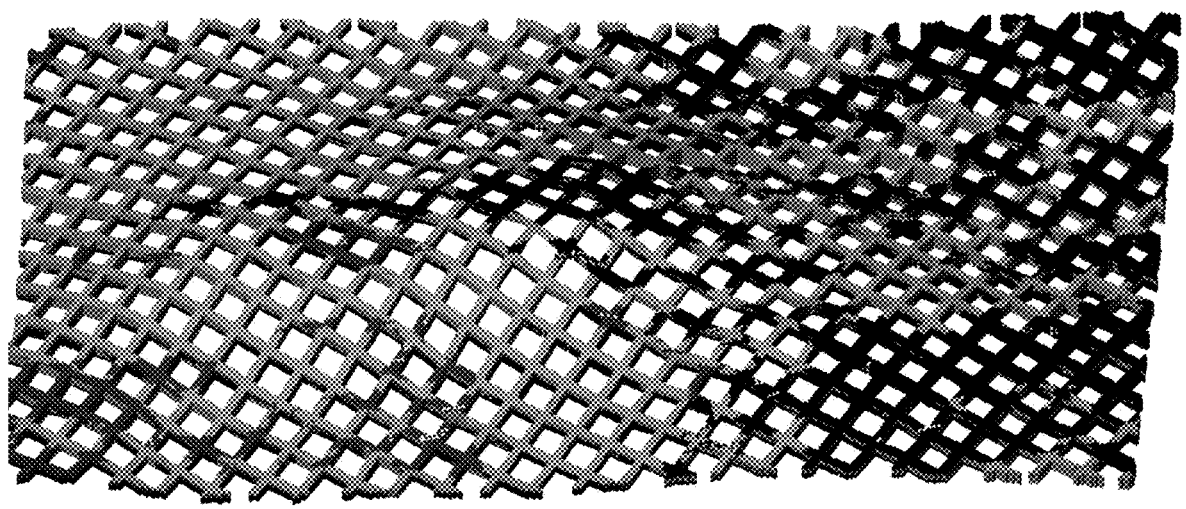
FIG. 9 illustrates a schematic diagram of a three-dimensional characterization result of the hydrocarbon secondary migration channel according to the illustrated embodiment of the present disclosure.

In an illustrated embodiment, a certain research area is taken as an example, and the three-dimensional characterization method of the hydrocarbon secondary migration channel provided by the present disclosure is used to characterize the hydrocarbon secondary migration channel thereof. In the present embodiment, the lithofacies attribute corresponding to the sandstone is 1, the lithofacies attribute corresponding to the mudstone is 2, the lithofacies attribute corresponding to the new value 1 is 3, the lithofacies attribute corresponding to the new value 2 is 0, and the lithofacies attribute corresponding to the new value 3 is 5. Specially, the lithofacies attribute judgment result of the present embodiment is shown in FIG. 8; and the hydrocarbon secondary migration channel of the present disclosure is shown in FIG. 9. As shown in FIG. 8, a first color-deepest part is the sand body area through which the fault passes with the lithofacies attribute of 0; a second color-deepest part is the zigzag connectivity area with the lithofacies attribute of 5; a dark-gray area (a third color-deepest part) is the isolated sand body area with the lithofacies attribute of 1; a color-shallow area is the semi-permeable mudstone area with the lithofacies attribute of 3; and a color-light gray area (a fourth color-deepest part) is a mudstone area with the lithofacies attribute of 2.

The judgment result of the present embodiment is that the area with the lithofacies attribute of 0 is the area with the largest aggregation probability of the hydrocarbons; the connectivity between the area with the lithofacies attribute of 0 and the area with the lithofacies attribute of 5 is good, and the hydrocarbons are capable of migrating between the two areas; the area with the lithofacies attribute of 3 is the semi-permeable area, and the connectivity thereof is poor; the area with the lithofacies attribute of 1 is the isolated sand body area, and there is no petroleum accumulation, and there is no hydrocarbon migration in the isolated sand body area; and the area with the lithofacies attribute of 2 is the mudstone area, which belong to the non-connected area.

In conclusion, the research and spatial characterization of the dredging characteristics of the three-dimensional space are crucial to the research on the hydrocarbon migration channel. Moreover, the migration of the hydrocarbons along the vertical direction and the lateral direction is analyzed based on the three-dimensional model, and then the hydrocarbon secondary migration channel is characterized, which, compared with the two-dimensional model, better conforms to the geological characteristics, has more accurate characterization result, and is more beneficial for guiding and developing the oil-gas reservoir. The present disclosure comprehensively analyzes the hydrocarbon secondary migration laws along both vertical and lateral directions in combination with the geological characteristics of the research area, thereby providing key information for guiding the exploration of the oil-gas reservoir and improving the exploration rate. Compared with the related art, the present disclosure has significant progress.

The above description only describes the illustrated embodiments of the present disclosure and is not intended to limit the present disclosure in any form. Although the present disclosure has been disclosed in the illustrated embodiments, the present disclosure is not limited thereto. Any simple modifications, equivalent changes and modifications made to the above embodiments according to the technology of the present disclosure without departing from the scope of the technical solutions of the present disclosure shall fall within the scope of the technical solutions of the present disclosure.

What is claimed is:

1. A three-dimensional characterization method of a hydrocarbon secondary migration channel, comprising the following steps:

step 1, collecting lithofacies seismic inversion data of a research area, and constructing a first three-dimensional geological model of the research area based on the lithofacies seismic inversion data; dividing the first three-dimensional geological model into a plurality of grids according to lithofacies data of the first three-dimensional geological model, with each grid having one of lithofacies attributes, and the lithofacies attributes comprising mudstone and sandstone;

step 2, performing lithofacies attribute determination and updating on planar mudstone data of the first three-dimensional geological model to obtain a second three-dimensional geological model;

step 3, performing lithofacies attribute determination and updating on sectional mudstone data of the second three-dimensional geological model to obtain a third three-dimensional geological model;

step 4, adding fault data of a fault into the third three-dimensional geological model, and updating lithofacies attributes of the sandstone in the third three-dimensional geological model according to an intersection relationship between a sand body distribution area and the fault to obtain a fourth three-dimensional geological model intersecting with the fault and a fifth three-dimensional geological model without intersecting with the fault;

step 5, performing a zigzag connectivity judgment on a sand body distribution area in the fifth three-dimensional geological model to obtain a judgment result, and updating lithofacies attributes of the fifth three-dimensional geological model according to the judgment result to obtain a sixth three-dimensional geological model;

step 6, obtaining a target three-dimensional geological model of the research area according to the fourth three-dimensional geological model and the sixth three-dimensional geological model; and step 7, determining the hydrocarbon secondary migration channel of the research area according to a lithofacies attribute of each grid in the target three-dimensional geological model, determining an area with updated lithofacies attributes obtained in the step 4 in the target three-dimensional geological model as an area with a largest aggregation probability of hydrocarbons, and performing oil-gas exploration on the area with the largest aggregation probability of hydrocarbons to obtain an oil-gas reservoir;

wherein the step 4 specifically comprises the following steps:

step 41, fitting boundary ranges of sandstones in the third three-dimensional geological model into continuous first surface data, and introducing the fault data of the fault into the third three-dimensional geological model, and fitting the fault data of the fault introduced into the third three-dimensional geological model into second surface data;

step 42, screening out a sand body surface in each layer intersecting with the fault through geographic coordinates and elevation data of the research area based on three-dimensional intersection judgment, and outputting the sand body surface in each layer as an intermediate three-dimensional geological model and outputting a part of the sand body distribution area without intersecting with the fault as the fifth three-dimensional geological model; and step 43, updating lithofacies attributes of discrete sand body data intersecting with the fault in the intermediate three-dimensional geological model to a first target value and maintaining lithofacies attributes of another part of the sand body distribution area without intersecting with the fault in the intermediate three-dimensional geological model unchanged, thereby to obtain the fourth three-dimensional geological model;

wherein the step 5 specifically comprises the following steps:

for a target sand body area without intersecting with the fault in each layer of the fifth three-dimensional geological model, determining whether there is a sand body area in upper and lower layers adjacent to the target sand body area intersecting with the target sand body area:

in response to determining that there is the sand body area in the upper and lower layers adjacent to the target sand body area intersecting with the target sand body area, determining whether there is the fault passing through the sand body area:

in response to determining that there is the fault passing through the sand body area, determining the target sand body area being a zigzag connected sand body, and updating lithofacies attributes of the target sand body area to a second target value;

in response to determining that there is not the fault passing through the sand body area, determining the target sand body area being an isolated sand body, and maintaining the lithofacies attributes of the target sand body area unchanged;

in response to determining that there is not the sand body area in the upper and lower layers adjacent to the target sand body area intersecting with the target sand body area, determining the target sand body area being the isolated sand body, and maintaining the lithofacies attributes of the target sand body area unchanged.

2. The three-dimensional characterization method of the hydrocarbon secondary migration channel according to claim 1, wherein the step 2 comprises the following steps:

in response to grids before, after, and on left and right of one of the plurality of grids which has the lithofacies attribute of the mudstone all having the lithofacies attribute of the sandstone, updating the lithofacies attribute of the one grid to a third target value; and in response to the grids before, after, and on the left and right of the one grid not all having the lithofacies attribute of the sandstone, maintaining the lithofacies attribute of the one grid unchanged.

3. The three-dimensional characterization method of the hydrocarbon secondary migration channel according to claim 1, wherein the step 3 comprises the following steps:

in response to grids in upper and lower layers adjacent to one of the plurality of grids which has the lithofacies attribute of the mudstone all having the lithofacies attribute of the sandstone, updating the lithofacies attribute of the one grid to a third target value; and in response to the grids in the upper and lower layers adjacent to the one grid which has the lithofacies attribute of the mudstone not all having the lithofacies attribute of the sandstone, maintaining the lithofacies attribute of the one grid unchanged;

determining and updating an updated grid obtained in the step 2 as follows:

in response to any grid in upper and lower layers adjacent to the updated grid having the lithofacies attribute of the mudstone, updating a lithofacies attribute of the updated grid to the mudstone; and in response to no grid in the upper and lower layers adjacent to the updated grid having the lithofacies attribute of the mudstone, maintaining the lithofacies attribute of the updated grid unchanged.

4. The three-dimensional characterization method of the hydrocarbon secondary migration channel according to claim 1, wherein the step 7 comprises the following steps:

determining a connectivity between the area with the updated lithofacies attributes obtained in the step 4 and an area with updated lithofacies attributes obtained in the step 5 in the target three-dimensional geological model being good, and the areas with the updated lithofacies attributes obtained in the steps 4-5 being capable of migrating the hydrocarbons;

determining an area with updated lithofacies attributes obtained in the step 2 and an area with updated lithofacies attributes obtained in the step 3 in the target three-dimensional geological model as a semi-permeable area with a poor connectivity;

determining an area with lithofacies attributes of the sandstone in the target three-dimensional geological model as an isolated sand body area without aggregating and migrating the hydrocarbons; and determining an area with lithofacies attributes of the mudstone in the target three-dimensional geological model as a non-connected area.

5. A three-dimensional characterization method of a hydrocarbon secondary migration channel, comprising the following steps:

step 1, collecting lithofacies seismic inversion data of a research area, and constructing a first three-dimensional geological model of the research area based on the lithofacies seismic inversion data; dividing the first three-dimensional geological model into a plurality of grids according to lithofacies data of the first three-dimensional geological model, with each grid having one of lithofacies attributes, and the lithofacies attributes comprising mudstone and sandstone;

step 2, performing lithofacies attribute determination and updating on planar mudstone data of the first three-dimensional geological model to obtain a second three-dimensional geological model;

step 3, performing lithofacies attribute determination and updating on sectional mudstone data of the second three-dimensional geological model to obtain a third three-dimensional geological model;

step 4, adding fault data of a fault into the third three-dimensional geological model, and updating lithofacies attributes of the sandstone in the third three-dimensional geological model according to an intersection relationship between a sand body distribution area and the fault to obtain a fourth three-dimensional geological model intersecting with the fault and a fifth three-dimensional geological model without intersecting with the fault; wherein the step 4 specifically comprises the following steps:

step 41, fitting boundary ranges of sandstones in the third three-dimensional geological model into continuous first surface data, and introducing the fault data of the fault into the third three-dimensional geological model, and fitting the fault data of the fault introduced into the third three-dimensional geological model into second surface data;

step 42, screening out a sand body surface in each layer intersecting with the fault through geographic coordinates and elevation data of the research area based on three-dimensional intersection judgment, and outputting the sand body surface in each layer as an intermediate three-dimensional geological model and outputting a part of the sand body distribution area without intersecting with the fault as the fifth three-dimensional geological model; and step 43, updating lithofacies attributes of discrete sand body data intersecting with the fault in the intermediate three-dimensional geological model to a first target value and maintaining lithofacies attributes of another part of the sand body distribution area without intersecting with the fault in the intermediate three-dimensional geological model unchanged, thereby to obtain the fourth three-dimensional geological model;

step 5, performing a zigzag connectivity judgment on a sand body distribution area in the fifth three-dimensional geological model to obtain a judgment result, and updating lithofacies attributes of the fifth three-dimensional geological model according to the judgment result to obtain a sixth three-dimensional geological model; wherein the step 5 specifically comprises the following steps:

for a target sand body area without intersecting with the fault in each layer of the fifth three-dimensional geological model, determining whether there is a sand body area in upper and lower layers adjacent to the target sand body area intersecting with the target sand body area:
in response to determining that there is the sand body area in the upper and lower layers adjacent to the target sand body area intersecting with the target sand body area, determining whether there is the fault passing through the sand body area:
   in response to determining that there is the fault passing through the sand body area, determining the target sand body area being a zigzag connected sand body, and updating lithofacies attributes of the target sand body area to a second target value;
   in response to determining that there is not the fault passing through the sand body area, determining the target sand body area being an isolated sand body, and maintaining the lithofacies attributes of the target sand body area unchanged;
in response to determining that there is not the sand body area in the upper and lower layers adjacent to the target sand body area intersecting with the target sand body area, determining the target sand body area being the isolated sand body, and maintaining the lithofacies attributes of the target sand body area unchanged;

step 6, obtaining a target three-dimensional geological model of the research area according to the fourth three-dimensional geological model and the sixth three-dimensional geological model, wherein the target three-dimensional geological model is represented as a three-dimensional raster graphic and is configured to reflect the sand body area through which the fault continuously passes, an overlapping relationship between sand bodies inside the target three-dimensional geological model, and a contact relationship on sectional surfaces of the target three-dimensional geological model; and step 7, determining the hydrocarbon secondary migration channel of the research area according to a lithofacies attribute of each grid in the target three-dimensional geological model, determining an area with updated lithofacies attributes obtained in the step 4 in the target three-dimensional geological model as an area with a largest aggregation probability of hydrocarbons, and performing oil-gas exploration on the area with the largest aggregation probability of hydrocarbons to obtain an oil-gas reservoir.

\* \* \* \* \*